United States Patent
Wu et al.

(10) Patent No.: US 12,342,636 B2
(45) Date of Patent: Jun. 24, 2025

(54) MANUFACTURING METHOD OF IMAGE SENSOR STRUCTURE

(71) Applicant: Powerchip Semiconductor Manufacturing Corporation, Hsinchu (TW)

(72) Inventors: Chien-Lung Wu, Hsinchu (TW); Yu-Han Kao, New Taipei (TW); Ching-Chun Chou, Hsinchu (TW); Yi-Shu Ou, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 432 days.

(21) Appl. No.: 18/150,801

(22) Filed: Jan. 6, 2023

(65) Prior Publication Data
US 2024/0170527 A1 May 23, 2024

(30) Foreign Application Priority Data
Nov. 23, 2022 (TW) .................................. 111144881

(51) Int. Cl.
*H10F 39/00* (2025.01)
*H10F 39/18* (2025.01)

(52) U.S. Cl.
CPC ........... *H10F 39/014* (2025.01); *H10F 39/18* (2025.01); *H10F 39/807* (2025.01)

(58) Field of Classification Search
None
See application file for complete search history.

(56) References Cited

U.S. PATENT DOCUMENTS

| 7,388,187 B1 | 6/2008 | Liu et al. |
| 9,312,293 B2 | 4/2016 | Nagaraja et al. |

OTHER PUBLICATIONS

Alice Pelamatti et al., "Comparison of Pinning Voltage Estimation Methods in Pinned Photodiode CMOS Image Sensors," IEEE Journal of the Electron Devices Society, vol. 4, Dec. 2015, pp. 99-108.
Masayuki Furumiya et al., "High sensitivity and No. cross-talk pixel technology for embedded CMOS image sensor," IEEE Transactions On Electron Devices, vol. 48, Oct. 2001, pp. 2221-2227.

*Primary Examiner* — Anthony Ho
(74) *Attorney, Agent, or Firm* — JCIPRNET

(57) ABSTRACT

A manufacturing method of an image sensor structure including the following steps is provided. A substrate structure is provided. A first patterned hard mask layer is formed on the substrate structure. The first patterned hard mask layer has a first opening. A first ion implantation process is performed on the substrate structure by using the first patterned hard mask layer as a mask to form a first isolation region in the substrate structure. A first hard mask layer is formed on the first patterned hard mask layer. The first hard mask layer is formed in the first opening to form a first recess. The width of the first recess is smaller than the width of the first opening. A second ion implantation process is performed on the substrate structure by using the first hard mask layer as a mask to form a doped region in the substrate structure.

20 Claims, 10 Drawing Sheets

MANUFACTURING METHOD OF IMAGE SENSOR STRUCTURE

CROSS-REFERENCE TO RELATED APPLICATION

This application claims the priority benefit of Taiwanese application no. 111144881, filed on Nov. 23, 2022. The entirety of the above-mentioned patent application is hereby incorporated by reference herein and made a part of this specification.

BACKGROUND

Technical Field

The invention relates to a manufacturing method of a semiconductor structure, and particularly relates to a manufacturing method of an image sensor structure.

Description of Related Art

The image sensor is widely used in many modern electronic devices (e.g., smart phone or digital camera). However, in the manufacturing process of the image sensor, many photomasks are used. Therefore, how to reduce the number of photomasks required in the manufacturing process of the image sensor is the goal of continuous efforts.

SUMMARY

The invention provides a manufacturing method of an image sensor structure, which can reduce the number of photomasks required in the manufacturing process of the image sensor structure, thereby reducing the manufacturing cost.

The invention provides a manufacturing method of an image sensor structure, which includes the following steps. A substrate structure is provided. A first patterned hard mask layer is formed on the substrate structure. The first patterned hard mask layer has a first opening. A first ion implantation process is performed on the substrate structure by using the first patterned hard mask layer as a mask to form a first isolation region in the substrate structure. A first hard mask layer is formed on the first patterned hard mask layer. The first hard mask layer is formed in the first opening to form a first recess. The width of the first recess is smaller than the width of the first opening. A second ion implantation process is performed on the substrate structure by using the first hard mask layer as a mask to form a doped region in the substrate structure. The depth of the first isolation region located in the substrate structure is greater than the depth of the doped region located in the substrate structure. The first isolation region and the doped region are separated from each other.

According to an embodiment of the invention, in the manufacturing method of the image sensor structure, the first hard mask layer may be conformally formed on the first patterned hard mask layer and in the first opening.

According to an embodiment of the invention, in the manufacturing method of the image sensor structure, the doped region may be located between the first isolation region and the top surface of the substrate structure.

According to an embodiment of the invention, in the manufacturing method of the image sensor structure, the width of the doped region may be smaller than the width of the first isolation region.

According to an embodiment of the invention, the manufacturing method of the image sensor structure may further include the following steps. A second hard mask layer is formed on the first patterned hard mask layer before the first hard mask layer is formed. The second hard mask layer is formed in the first opening to form a second recess. The width of the second recess may be smaller than the width of the first opening. A third ion implantation process is performed on the substrate structure by using the second hard mask layer as a mask to form a pinning layer in the substrate structure. The depth of the pinning layer located in the substrate structure may be smaller than the depth of the doped region located in the substrate structure. The pinning layer and the doped region may be in contact with each other.

According to an embodiment of the invention, in the manufacturing method of the image sensor structure, the second hard mask layer may be conformally formed on the first patterned hard mask layer and in the first opening.

According to an embodiment of the invention, in the manufacturing method of the image sensor structure, the pinning layer may be located between the doped region and the top surface of the substrate structure.

According to an embodiment of the invention, in the manufacturing method of the image sensor structure, the width of the pinning layer may be smaller than the width of the first isolation region.

According to an embodiment of the invention, in the manufacturing method of the image sensor structure, the width of the doped region may be smaller than the width of the pinning layer.

According to an embodiment of the invention, in the manufacturing method of the image sensor structure, the first hard mask layer may be formed on the second hard mask layer and in the second recess. The width of the first recess may be smaller than the width of the second recess.

According to an embodiment of the invention, in the manufacturing method of the image sensor structure, the first hard mask layer may be conformally formed on the second hard mask layer and in the second recess.

According to an embodiment of the invention, the manufacturing method of the image sensor structure may further include the following steps. The first hard mask layer and the first patterned hard mask layer are removed. A second patterned hard mask layer is formed on the substrate structure. The second patterned hard mask layer has a second opening. A second hard mask layer is formed on the second patterned hard mask layer. The second hard mask layer is formed in the second opening to form a second recess. The width of the second recess may be smaller than the width of the second opening. A third ion implantation process is performed on the substrate structure by using the second hard mask layer as a mask to form a second isolation region in the substrate structure. The second isolation region is located aside the doped region.

According to an embodiment of the invention, the manufacturing method of the image sensor structure may further include the following step. An isolation structure is formed in the substrate structure. The second isolation region may be located directly below the isolation structure.

According to an embodiment of the invention, in the manufacturing method of the image sensor structure, the bottom of the doped region may be lower than the bottom of the isolation structure.

According to an embodiment of the invention, in the manufacturing method of the image sensor structure, the bottom of the second isolation region may be lower than the bottom of the doped region.

According to an embodiment of the invention, the manufacturing method of the image sensor structure may further include the following step. A stop layer is formed on the substrate structure before the first patterned hard mask layer is formed.

According to an embodiment of the invention, in the manufacturing method of the image sensor structure, the first patterned hard mask layer may be formed on the stop layer.

According to an embodiment of the invention, the manufacturing method of the image sensor structure may further include the following step. A pad layer is formed on the substrate structure before the stop layer is formed.

According to an embodiment of the invention, in the manufacturing method of the image sensor structure, the stop layer may be formed on the pad layer.

According to an embodiment of the invention, in the manufacturing method of the image sensor structure, the substrate structure may include a substrate and an epitaxial layer. The epitaxial layer is located on the substrate.

Based on the above description, in the manufacturing method of the image sensor structure according to the invention, the first patterned hard mask layer has the first opening. The first ion implantation process is performed on the substrate structure by using the first patterned hard mask layer as a mask to form the first isolation region in the substrate structure. The first hard mask layer is formed in the first opening to form the first recess. The width of the first recess is smaller than the width of the first opening. The second ion implantation process is performed on the substrate structure by using the first hard mask layer as a mask to form the doped region in the substrate structure. In this way, the manufacturing method of the image sensor structure according to the invention only needs one photomask to form the first isolation region and the doped region, so the number of photomasks required in the manufacturing process of the image sensor structure can be reduced, thereby reducing the manufacturing cost. In addition, since the manufacturing method of the image sensor structure according to the invention only needs one photomask to form the first isolation region and doped region, the problem of the overlay shift caused by forming the first isolation region and the doped region through a plurality of photomasks can be prevented. Furthermore, in the manufacturing method of the image sensor structure according to the invention, the width of the doped region can be determined by the width of the first recess, and the width of the first recess can be flexibly adjusted by adjusting the thickness of the first hard mask layer, so the width of the doped region can be flexibly adjusted. In this way, it is beneficial to manufacture an image sensor device with a smaller size.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1I are cross-sectional views illustrating a manufacturing process of an image sensor structure according to some embodiments of the invention. FIG. 2 is a cross-sectional view illustrating an image sensor structure according to other embodiments of the invention.

Figure 1A:
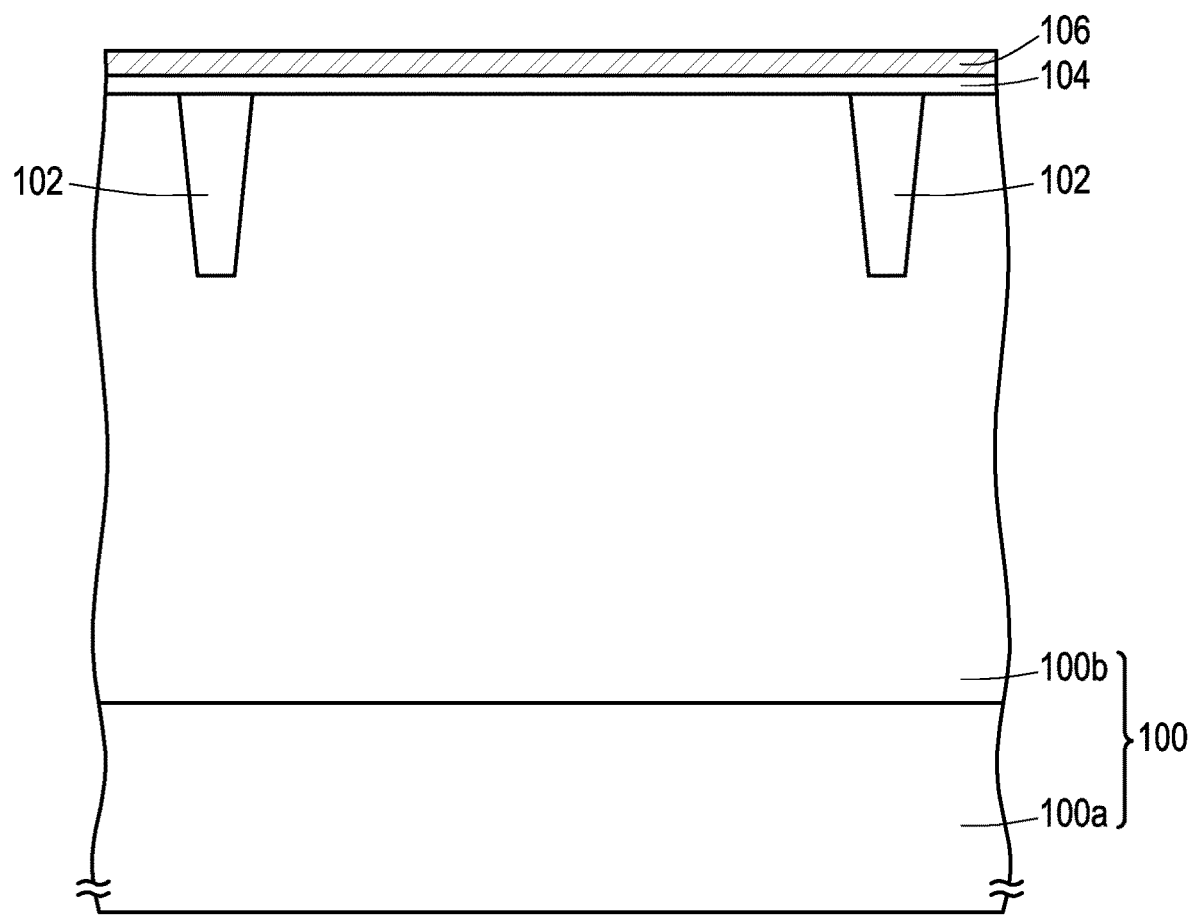
FIG. 1A to FIG. 1I are cross-sectional views illustrating a manufacturing process of an image sensor structure according to some embodiments of the invention.
Figure 2:
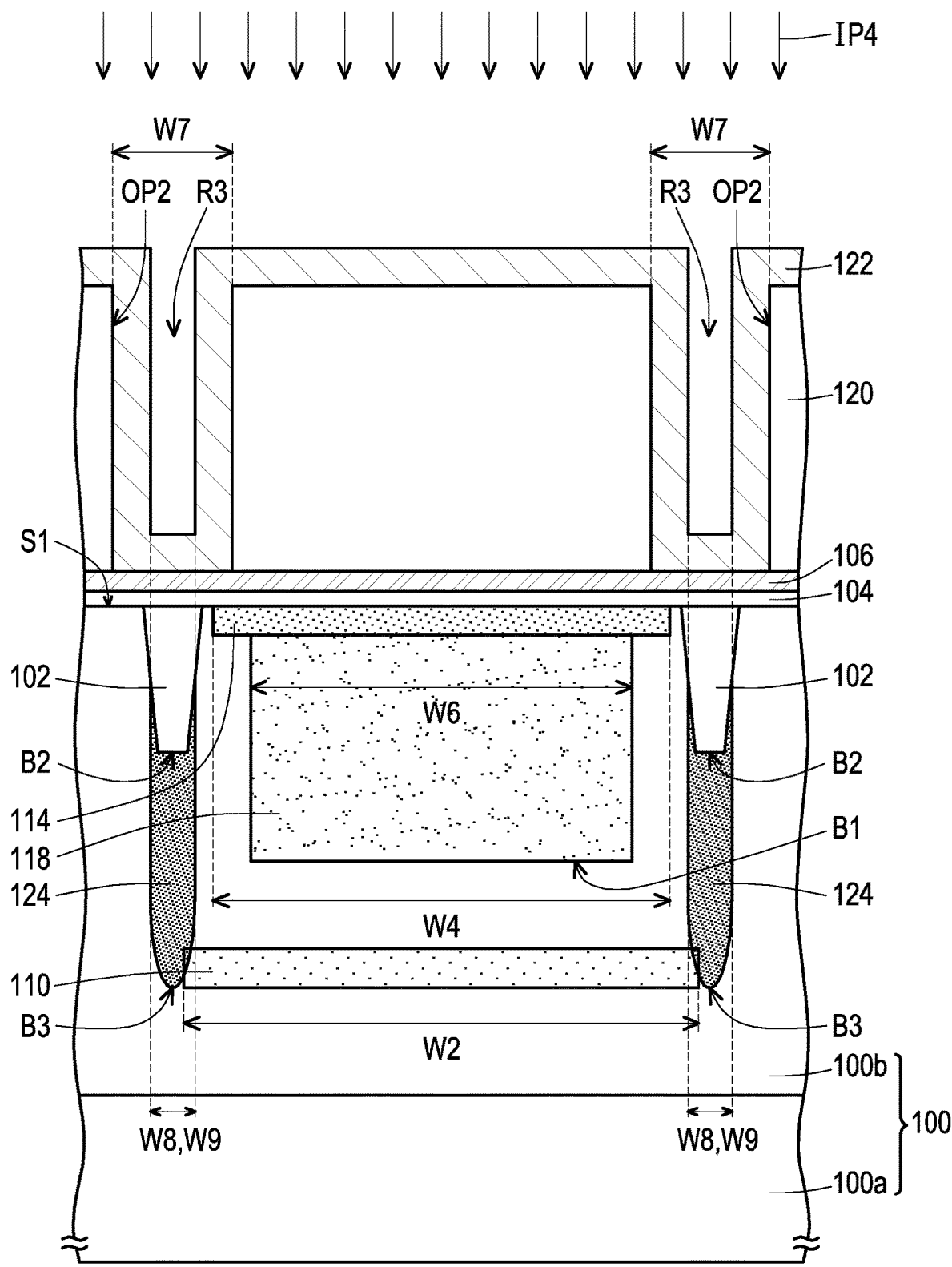
FIG. 2 is a cross-sectional view illustrating an image sensor structure according to other embodiments of the invention.

Referring to FIG. 1A, a substrate structure 100 is provided. The substrate structure 100 may be a single-layer structure or a multilayer structure. In the present embodiment, the substrate structure 100 is, for example, a multilayer structure, but the invention is not limited thereto. For example, the substrate structure 100 may include a substrate 100a and an epitaxial layer 100b. In some embodiments, the substrate 100a may be a semiconductor substrate such as a silicon substrate. In some embodiments, the substrate 100a may have the first conductivity type (e.g., P-type). The epitaxial layer 100b is located on the substrate 100a. In some embodiments, the epitaxial layer 100b may be a semiconductor layer such as an epitaxial silicon layer. In some embodiments, the epitaxial layer 100b may have the first conductivity type (e.g., P-type).

Hereinafter, the first conductivity type and the second conductivity type may be one and the other of a P-type conductivity type and an N-type conductivity type, respectively. In the present embodiment, the first conductivity type is, for example, a P-type conductivity type, and the second conductivity type is, for example, an N-type conductivity type, but the invention is not limited thereto. In other embodiments, the first conductivity type may be an N-type conductivity type, and the second conductivity type may be a P-type conductivity type.

In some embodiments, an isolation structure 102 may be formed in substrate structure 100. In some embodiments, the isolation structure 102 may be formed in the epitaxial layer 100b. In some embodiments, the isolation structure 102 is, for example, a shallow trench isolation (STI) structure. In some embodiments, the material of the isolation structure 102 is, for example, silicon oxide.

A pad layer 104 may be formed on the substrate structure 100. In some embodiments, the pad layer 104 may be formed on the epitaxial silicon layer 100b. In some embodiments, the material of the pad layer 104 is, for example, silicon oxide. In some embodiments, the method of forming the pad layer 104 is, for example, a thermal oxidation method or a chemical vapor deposition (CVD) method.

A stop layer 106 may be formed on the substrate structure 100. In some embodiments, the stop layer 106 may be formed on the pad layer 104. In some embodiments, the material of the stop layer 106 is, for example, silicon nitride (SiN), titanium (Ti), titanium nitride (TiN), tungsten silicide (WSi), tungsten (W), or tungsten nitride (WN)). In some embodiments, the stop layer 106 is formed by a CVD method or a physical vapor deposition (PVD) method.

Figure 1B:
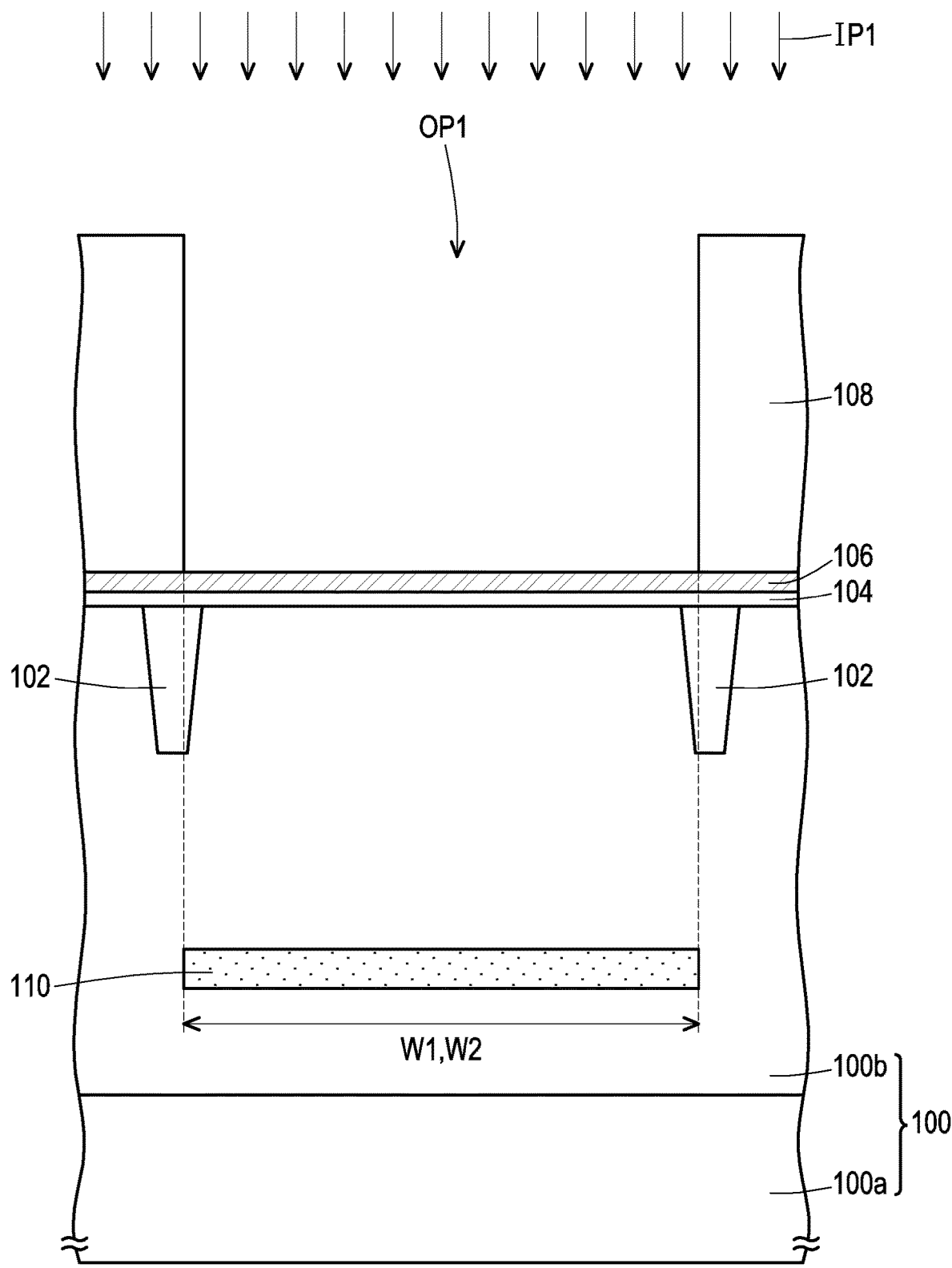

Referring to FIG. 1B, a patterned hard mask layer 108 is formed on the substrate structure 100. The patterned hard mask layer 108 has an opening OP1. The opening OP1 may have a width W1. In some embodiments, the opening OP1 may pass through the patterned hard mask layer 108. In some embodiments, the patterned hard mask layer 108 may be formed on the stop layer 106. In some embodiments, the material of the patterned hard mask layer 108 is, for example, silicon oxide or silicon nitride. In the present embodiment, the material of the patterned hard mask layer 108 is, for example, silicon oxide. In some embodiments, the method of forming the patterned hard mask layer 108 may include the following steps, but the invention is not limited thereto. First, a hard mask material layer (not shown) may be formed on the stop layer 106. In some embodiments, the method of forming the hard mask material layer is, for example, a CVD method. Then, the hard mask material layer may be patterned by a lithography process and an etching process (e.g., dry etching process) to form the patterned hard mask layer 108.

An ion implantation process IP1 is performed on the substrate structure 100 by using the patterned hard mask layer 108 as a mask to form an isolation region 110 in the substrate structure 100. The isolation region 110 can be used to prevent the electrical crosstalk. The isolation region 110 may have a width W2. In some embodiments, the width W2 of the isolation region 110 can be determined by the width W1 of the opening OP1. In some embodiments, the width W2 of the isolation region 110 and the width W1 of the opening OP1 may be the same. In other embodiments, the width W2 of the isolation region 110 and the width W1 of the opening OP1 may be different. In some embodiments, the isolation region 110 may have the first conductivity type (e.g., P-type). In some embodiments, the isolation region 110 may be a first conductivity type doped region (e.g., P-type doped region).

Figure 1C:
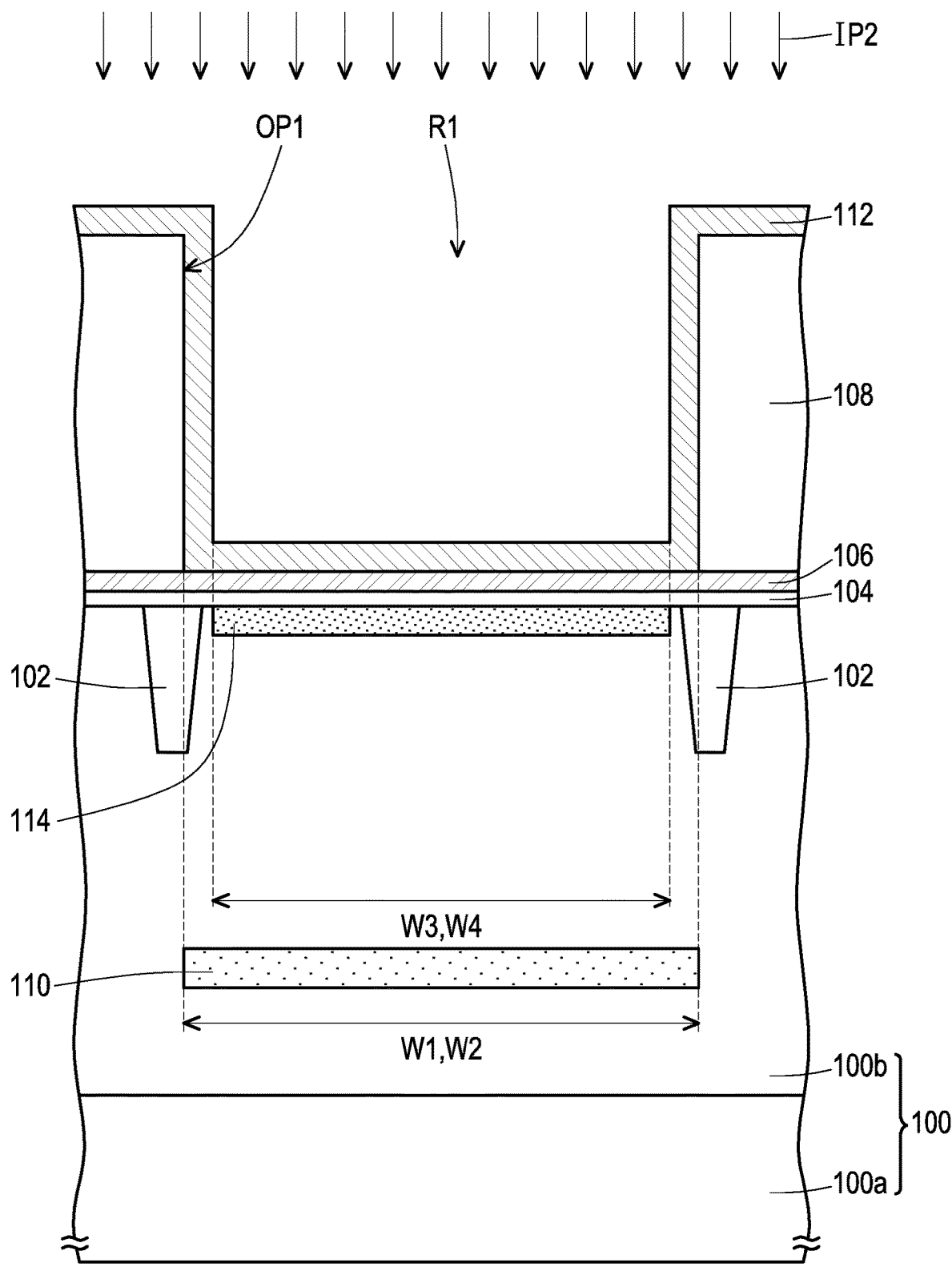

Referring to FIG. 1C, a hard mask layer 112 may be formed on the patterned hard mask layer 108. The hard mask layer 112 is formed in the opening OP1 to form a recess R1. The width W3 of the recess R1 may be smaller than the width W1 of the opening OP1. In some embodiments, the hard mask layer 112 may be conformally formed on the patterned hard mask layer 108 and in the opening OP1. In some embodiments, the material of the hard mask layer 112 is, for example, silicon oxide, titanium, or titanium nitride. In the present embodiment, the material of the hard mask layer 112 is, for example, silicon oxide. In some embodiments, the method of forming the hard mask layer 112 is, for example, an atomic layer deposition (ALD) method or a CVD method.

An ion implantation process IP2 may be performed on the substrate structure 100 by using the hard mask layer 112 as a mask to form a pinning layer 114 in the substrate structure 100. The pinning layer 114 can be used to reduce the dark current. In some embodiments, the pinning layer 114 may be located directly above the isolation region 110. The pinning layer 114 may have a width W4. In some embodiments, the width W4 of the pinning layer 114 can be determined by the width W3 of the recess R1. In some embodiments, the width W4 of the pinning layer 114 and the width W3 of the recess R1 may be the same. In other embodiments, the width W4 of the pinning layer 114 and the width W3 of the recess R1 may be different. In some embodiments, the width W4 of the pinning layer 114 may be smaller than the width W2 of the isolation region 110. In some embodiments, the pinning layer 114 may have the first conductivity type (e.g., P-type). In some embodiments, the pinning layer 114 may be a first conductivity type doped region (e.g., P-type doped region).

Figure 1D:
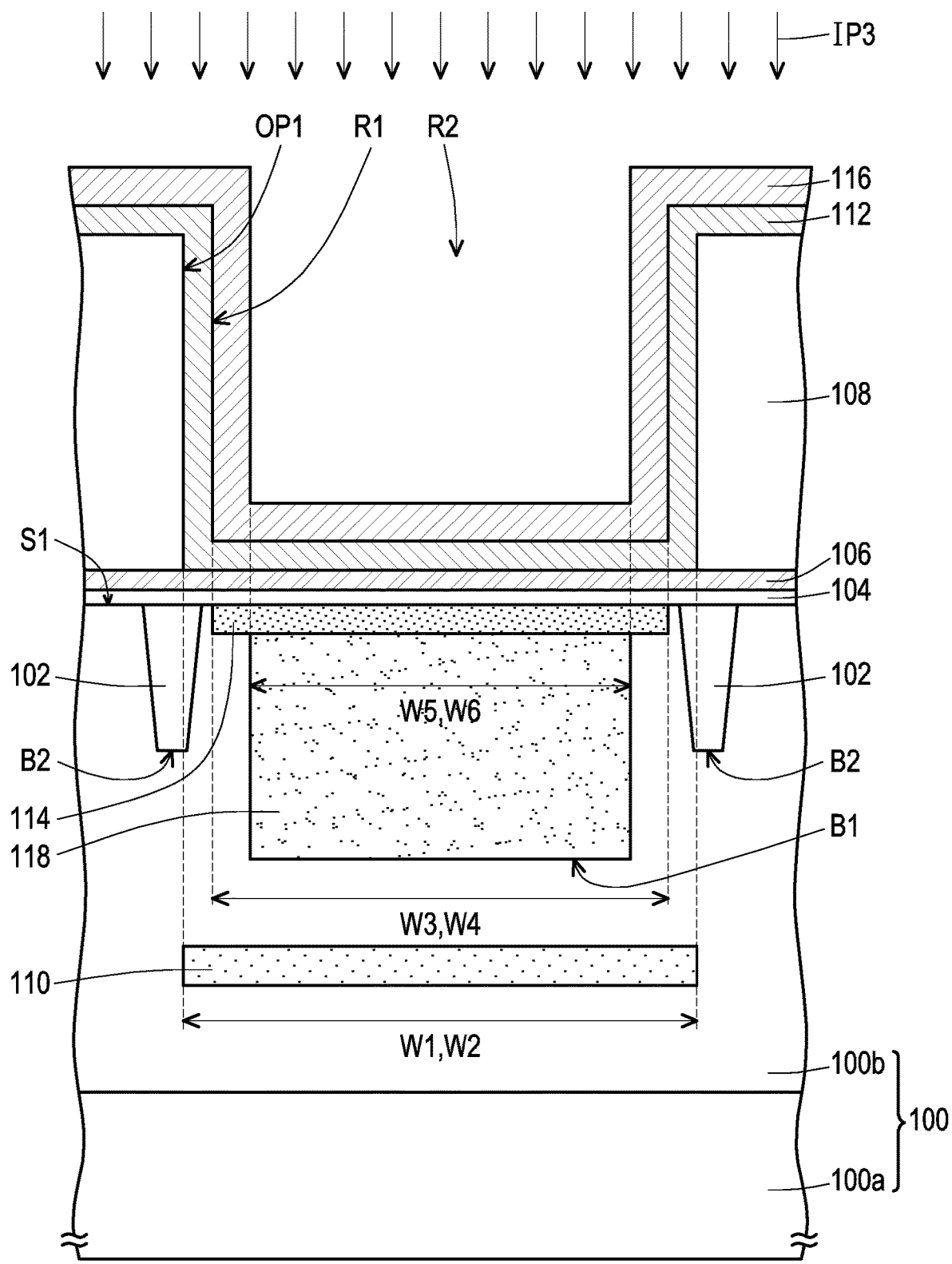

Referring to FIG. 1D, a hard mask layer 116 is formed on the patterned hard mask layer 108. The hard mask layer 116 is formed in the opening OP1 to form a recess R2. The width W5 of the recess R2 is smaller than the width W1 of the opening OP1. In some embodiments, the width W5 of the recess R2 may be smaller than the width W3 of the recess R1. In some embodiments, the hard mask layer 116 may be conformally formed on the patterned hard mask layer 108 and in opening OP1. In some embodiments, the hard mask layer 116 may be formed on the hard mask layer 112 and in the recess R1. In some embodiments, the hard mask layer 116 may be conformally formed on the hard mask layer 112 and in the recess R1. In some embodiments, the material of the hard mask layer 116 is, for example, silicon oxide, titanium, or titanium nitride. In the present embodiment, the material of the hard mask layer 116 is, for example, silicon oxide. In some embodiments, the method of forming the hard mask layer 116 is, for example, an ALD method or a CVD method.

An ion implantation process IP3 is performed on the substrate structure 100 by using the hard mask layer 116 as a mask to form a doped region 118 in the substrate structure 100. The depth of the isolation region 110 located in the substrate structure 100 is greater than the depth of the doped region 118 located in the substrate structure 100. The isolation region 110 and the doped region 118 are separated from each other. In some embodiments, the depth of the pinning layer 114 located in substrate structure 100 may be smaller than the depth of the doped region 118 located in substrate structure 100. In some embodiments, the pinning layer 114 and the doped region 118 may be in contact with each other. In some embodiments, the doped region 118 may be a region of a photodiode. In some embodiments, the doped region 118 may be located between the isolation region 110 and the top surface S1 of the substrate structure 100. In some embodiments, the pinning layer 114 may be located between the doped region 118 and the top surface S1 of the substrate structure 100. In some embodiments, the bottom B1 of the doped region 118 may be lower than the bottom B2 of the isolation structure 102.

The doped region 118 may have a width W6. In some embodiments, the width W6 of the doped region 118 can be determined by the width W5 of the recess R2. In some embodiments, the width W6 of the doped region 118 and the width W5 of the recess R2 may be the same. In other embodiments, the width W6 of the doped region 118 and the width W5 of the recess R2 may be different. In some embodiments, the width W6 of the doped region 118 may be smaller than the width W2 of the isolation region 110. In some embodiments, the width W6 of the doped region 118 may be smaller than the width W4 of the pinning layer 114. In some embodiments, the doped region 118 may have a second conductivity type (e.g., N-type). In some embodiments, the doped region 118 may be a second conductivity type doped region (e.g., N-type doped region).

In some embodiments, the above manufacturing method of the image sensor structure only needs one photomask to form the isolation region 110, the pinning layer 114, and the doped region 118, so the number of photomasks required in the manufacturing process of the image sensor structure can be reduced, thereby reducing the manufacturing cost.

In some embodiments, since the above manufacturing method of the image sensor structure only needs one photomask to form the isolation region 110, the pinning layer 114, and the doped region 118, the problem of the overlay shift caused by forming the isolation region 110, the pinning layer 114, and the doped region 118 through a plurality of photomasks can be prevented.

In some embodiments, in the above manufacturing method of the image sensor structure, the width W6 of the doped region 118 can be determined by the width W5 of the recess R2, and the width W5 of the recess R2 can be flexibly adjusted by adjusting the thickness of the hard mask layer 116, so the width W6 of the doped region 118 can be flexibly adjusted.

In some embodiments, in the above manufacturing method of the image sensor structure, the width W4 of the pinning layer 114 can be determined by the width W3 of the recess R1, and the width W3 of the recess R1 can be flexibly adjusted by adjusting the thickness of the hard mask layer 112, so the width W4 of the pinning layer 114 can be flexibly adjusted.

Figure 1E:
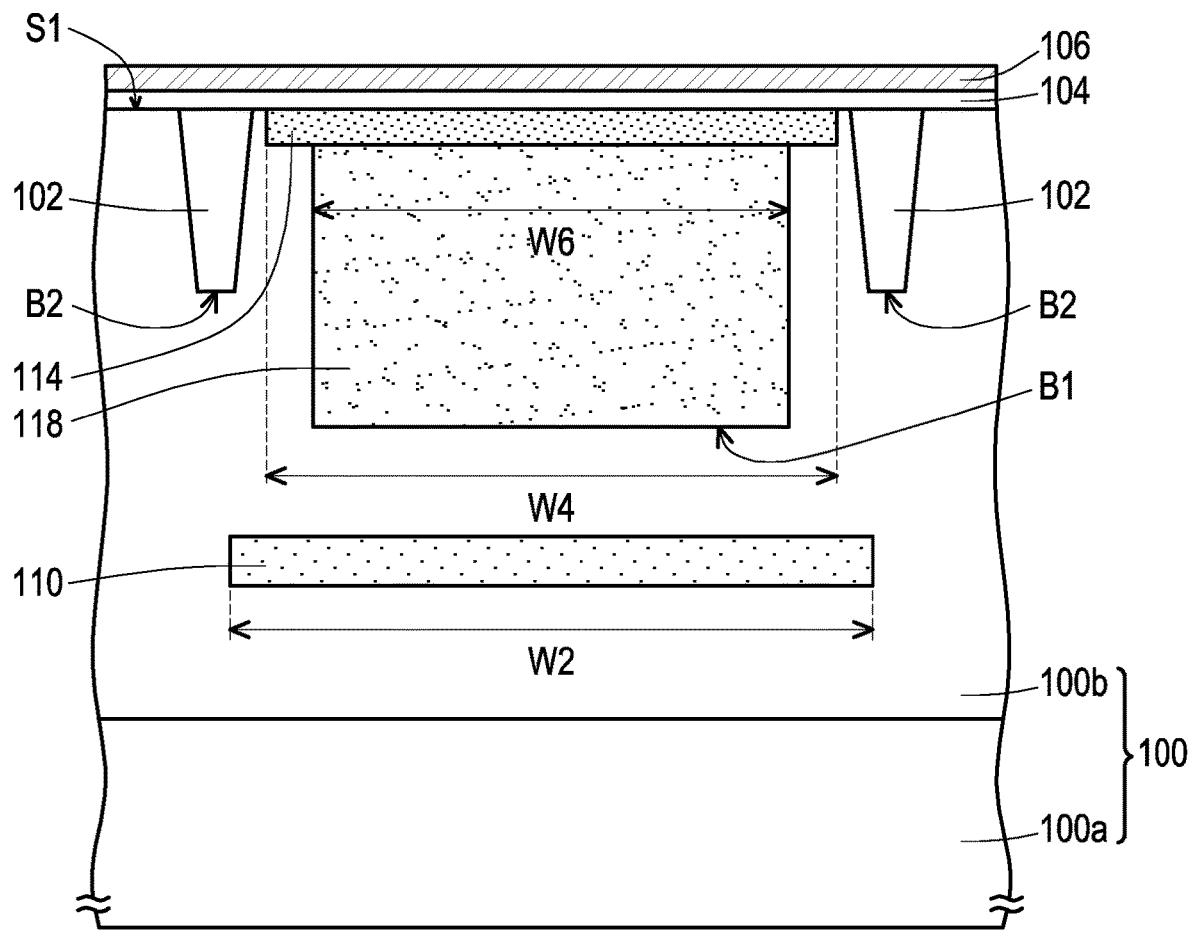

Referring to FIG. 1E, the hard mask layer 116, the hard mask layer 112, and the patterned hard mask layer 108 may be removed. In some embodiments, the process of removing the hard mask layer 116, the hard mask layer 112, and the patterned hard mask layer 108 may stop on the stop layer 106. In some embodiments, the method of removing the hard mask layer 116, the hard mask layer 112, and the patterned hard mask layer 108 is, for example, a chemical mechanical polishing (CMP) method, a wet etching method, a dry etching method, or a combination thereof.

Figure 1F:
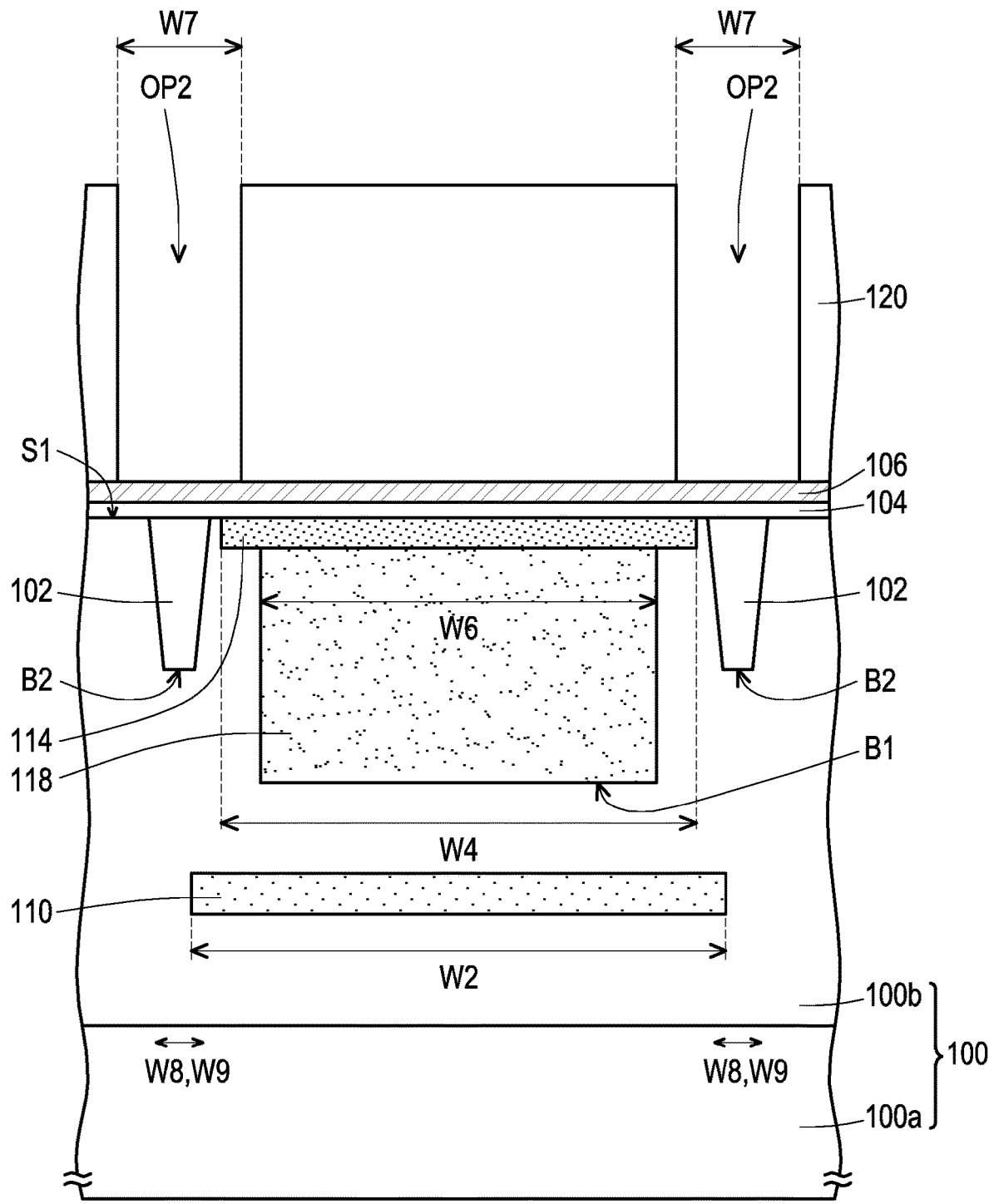

Referring to FIG. 1F, a patterned hard mask layer 120 may be formed on the substrate structure 100. The patterned hard mask layer 120 has an opening OP2. The opening OP2 may have a width W7. In some embodiments, the opening OP2 may pass through the patterned hard mask layer 120. In some embodiments, the opening OP2 may be located directly above the isolation structure 102. In some embodiments, the patterned hard mask layer 120 may be formed on the stop layer 106. In some embodiments, the material of the patterned hard mask layer 120 is, for example, silicon oxide or silicon nitride. In some embodiments, the method of forming the patterned hard mask layer 120 may include the following steps, but the invention is not limited thereto. First, a hard mask material layer (not shown) may be formed on the stop layer 106. In some embodiments, the method of forming the hard mask material layer is, for example, a CVD method. Then, the hard mask material layer may be patterned by a lithography process and an etching process (e.g., dry etching process) to form the patterned hard mask layer 120.

Figure 1G:
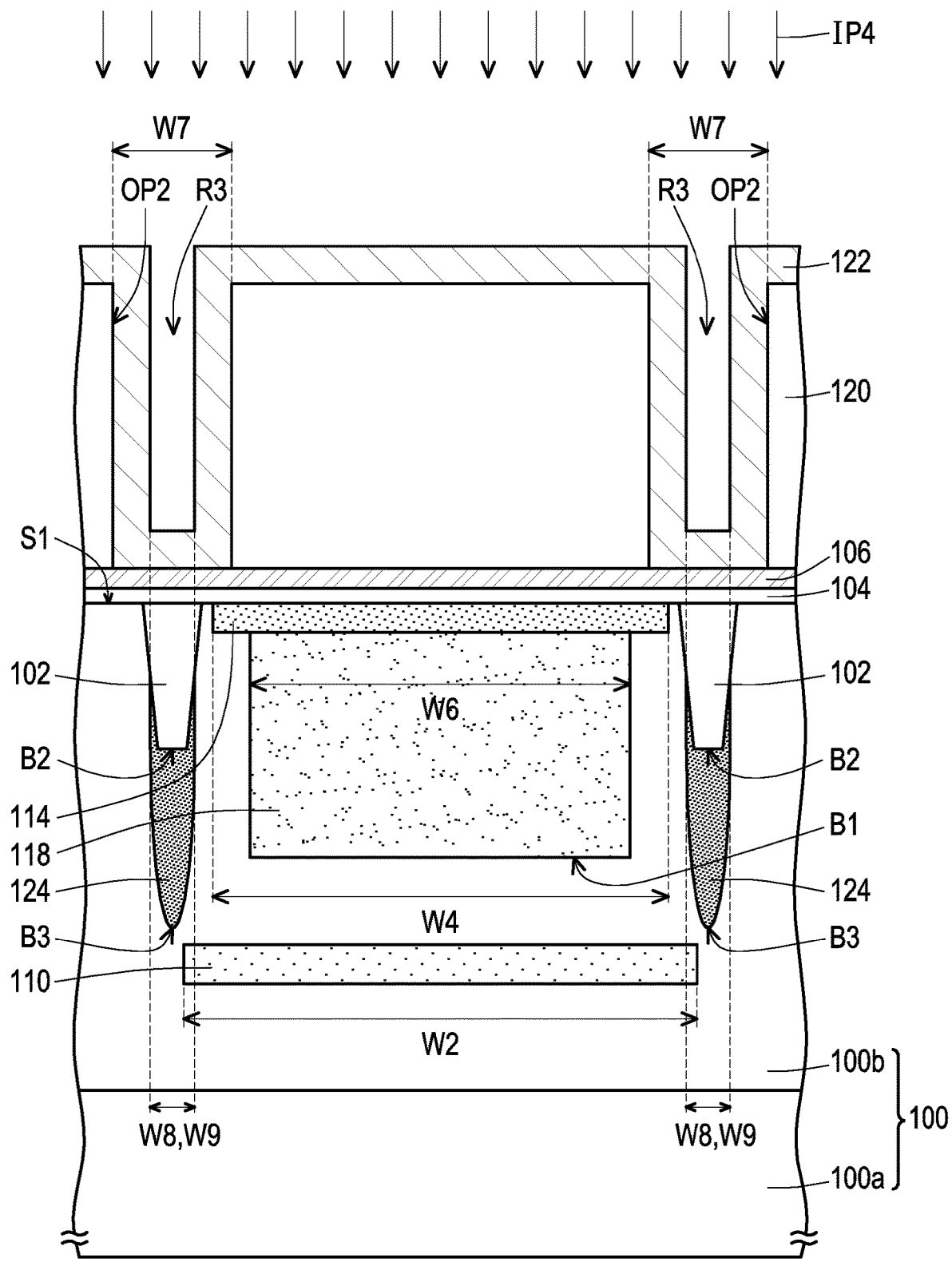

Referring to FIG. 1G, a hard mask layer 122 may be formed on the patterned hard mask layer 120. The hard mask layer 122 is formed in the opening OP2 to form a recess R3. The width W8 of the recess R3 may be smaller than the width W7 of the opening OP2. In some embodiments, the hard mask layer 122 may be conformally formed on the patterned hard mask layer 120 and in the opening OP2. In some embodiments, the material of the hard mask layer 122 is, for example, silicon oxide, titanium, or titanium nitride. In the present embodiment, the material of the hard mask layer 122 is, for example, titanium nitride. In some embodiments, the method of forming the hard mask layer 122 is, for example, an ALD method or a CVD method.

An ion implantation process IP4 may be performed on the substrate structure 100 by using the hard mask layer 122 as a mask to form an isolation region 124 in the substrate structure 100. The isolation region 124 is located aside the doped region 118. The isolation region 124 can be used to prevent the electrical crosstalk. In some embodiments, the isolation region 124 may be located directly below the isolation structure 102. In some embodiments, the bottom B3 of the isolation region 124 may be lower than the bottom B1 of the doped region 118. In some embodiments, as shown in FIG. 1G, the isolation region 124 and the isolation region 110 may be separated from each other, but the invention is not limited thereto. In other embodiments, as shown in FIG. 2, the isolation region 124 and the isolation region 110 may be connected to each other. In other embodiments, as shown in FIG. 2, the isolation region 124 and the isolation region 110 may have an overlapping region.

The isolation region 124 may have a width W9. In some embodiments, the width W9 of the isolation region 124 can be determined by the width W8 of the recess R3. In some embodiments, the width W9 of the isolation region 124 and the width W8 of the recess R3 may be the same. In other embodiments, the width W9 of the isolation region 124 and the width W8 of the recess R3 may be different. In some embodiments, the isolation region 124 may have the first conductivity type (e.g., P-type). In some embodiments, the isolation region 124 may be a first conductivity type doped region (e.g., P-type doped region).

In some embodiments, in the above manufacturing method of the image sensor structure, the width W9 of the isolation region 124 can be determined by the width W8 of the recess R3, and the width W8 of the recess R3 can be flexibly adjusted by adjusting the thickness of the hard mask layer 122, so the width W9 of the isolation region 124 can be flexibly adjusted.

Figure 1H:
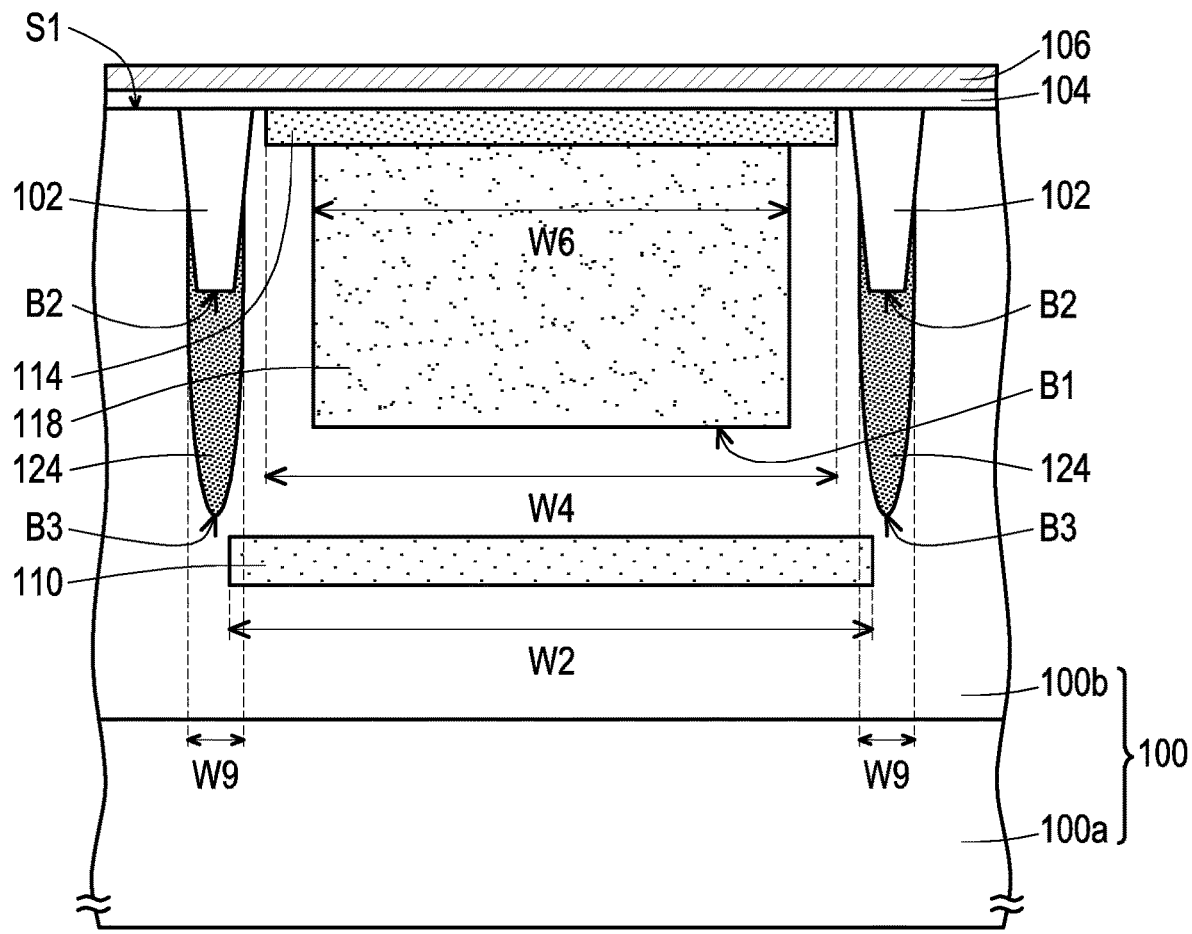
Figure 1I:
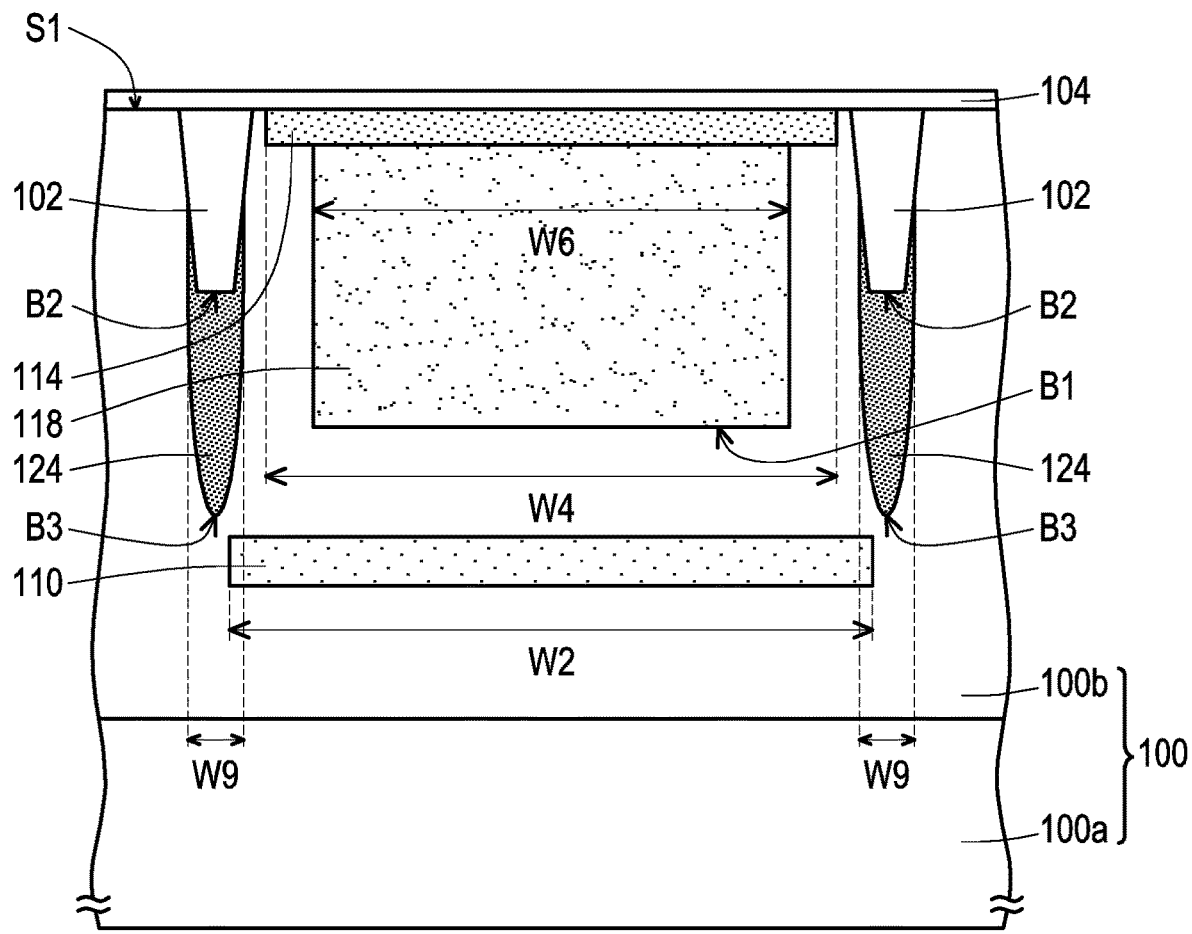

Referring to FIG. 1H, the hard mask layer 122 and the patterned hard mask layer 120 may be removed. In some embodiments, the process of removing the hard mask layer 122 and the patterned hard mask layer 120 may stop on the stop layer 106. In some embodiments, the method of removing the hard mask layer 122 and the patterned hard mask layer 120 is, for example, a CMP method, a wet etching method, a dry etching method, or a combination thereof. Referring to FIG. 1I, the stop layer 106 may be removed. The method of removing the stop layer 106 is, for example, a wet etching method or a dry etching method. In some embodiments, whether to remove the pad layer 104 may be determined according to the product requirement.

Based on the above embodiments, in the above manufacturing method of the image sensor structure, the patterned hard mask layer 108 has the opening OP1. The ion implantation process IP1 is performed on the substrate structure 100 by using the patterned hard mask layer 108 as a mask to form the isolation region 110 in the substrate structure 100. The hard mask layer 116 is formed in the opening OP1 to form the recess R2. The width W5 of the recess R2 is smaller than the width W1 of the opening OP1. The ion implantation process IP3 is performed on the substrate structure 100 by using the hard mask layer 116 as a mask to form the doped region 118 in the substrate structure 100. In this way, the manufacturing method of the image sensor structure of the above embodiments only needs one photomask to form the isolation region 110 and the doped region 118, so the number of photomasks required in the manufacturing process of the image sensor structure can be reduced, thereby reducing the manufacturing cost. In addition, since the manufacturing method of the image sensor structure of the above embodiments only needs one photomask to form the isolation region 110 and the doped region 118, the problem of the overlay shift caused by forming the isolation region 110 and the doped region 118 through a plurality of photomasks can be prevented. Furthermore, in the manufacturing method of the image sensor structure of the above embodiments, the width W6 of the doped region 118 can be determined by the width W5 of the recess R2, and the width W5 of the recess R2 can be flexibly adjusted by adjusting the thickness of the hard mask layer 116, so the width W6 of the doped region 118 can be flexibly adjusted. In this way, it is beneficial to manufacture an image sensor device with a smaller size.

In summary, in the manufacturing method of the image sensor structure of the aforementioned embodiments, a first patterned hard mask layer has a first opening. A first ion implantation process is performed on a substrate structure by using the first patterned hard mask layer as a mask to form a first isolation region in the substrate structure. A first hard mask layer is formed in the first opening to form a first recess. The width of the first recess is smaller than the width of the first opening. A second ion implantation process is performed on the substrate structure by using the first hard mask layer as a mask to form a doped region in the substrate structure. In this way, the manufacturing method of the image sensor structure of the aforementioned embodiments only needs one photomask to form the first isolation region and the doped region, so the number of the photomasks required in the manufacturing process of the image sensor structure can be reduced, thereby reducing the manufacturing cost. In addition, since the manufacturing method of the image sensor structure of the aforementioned embodiments only needs one photomask to form the first isolation region and doped region, the problem of the overlay shift caused by forming the first isolation region and the doped region through a plurality of photomasks can be prevented. Furthermore, in the manufacturing method of the image sensor structure of the aforementioned embodiments, the width of the doped region can be determined by the width of the first recess, and the width of the first recess can be flexibly adjusted by adjusting the thickness of the first hard mask layer, so the width of the doped region can be flexibly adjusted. In this way, it is beneficial to manufacture an image sensor device with a smaller size.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method for an image sensor structure, comprising:
   providing a substrate structure;
   forming a first patterned hard mask layer on the substrate structure, wherein the first patterned hard mask layer has a first opening;
   performing a first ion implantation process on the substrate structure by using the first patterned hard mask layer as a mask to form a first isolation region in the substrate structure;
   forming a first hard mask layer on the first patterned hard mask layer, wherein the first hard mask layer is formed in the first opening to form a first recess, and a width of the first recess is smaller than a width of the first opening; and
   performing a second ion implantation process on the substrate structure by using the first hard mask layer as a mask to form a doped region in the substrate structure, wherein a depth of the first isolation region located in the substrate structure is greater than a depth of the doped region located in the substrate structure, and the first isolation region and the doped region are separated from each other.

2. The manufacturing method of the image sensor structure according to claim 1, wherein the first hard mask layer is conformally formed on the first patterned hard mask layer and in the first opening.

3. The manufacturing method of the image sensor structure according to claim 1, wherein the doped region is located between the first isolation region and a top surface of the substrate structure.

4. The manufacturing method of the image sensor structure according to claim 1, wherein a width of the doped region is smaller than a width of the first isolation region.

5. The manufacturing method of the image sensor structure according to claim 1, further comprising:
   forming a second hard mask layer on the first patterned hard mask layer before forming the first hard mask layer, wherein the second hard mask layer is formed in the first opening to form a second recess, and a width of the second recess is smaller than the width of the first opening; and
   performing a third ion implantation process on the substrate structure by using the second hard mask layer as a mask to form a pinning layer in the substrate structure, wherein a depth of the pinning layer located in the substrate structure is smaller than the depth of the doped region located in the substrate structure, and the pinning layer and the doped region are in contact with each other.

6. The manufacturing method of the image sensor structure according to claim 5, wherein the second hard mask layer is conformally formed on the first patterned hard mask layer and in the first opening.

7. The manufacturing method of the image sensor structure according to claim 5, wherein the pinning layer is located between the doped region and a top surface of the substrate structure.

8. The manufacturing method of the image sensor structure according to claim 5, wherein a width of the pinning layer is smaller than a width of the first isolation region.

9. The manufacturing method of the image sensor structure according to claim 5, wherein a width of the doped region is smaller than a width of the pinning layer.

10. The manufacturing method of the image sensor structure according to claim 5, wherein
    the first hard mask layer is formed on the second hard mask layer and in the second recess, and
    the width of the first recess is smaller than the width of the second recess.

11. The manufacturing method of the image sensor structure according to claim 10, wherein the first hard mask layer is conformally formed on the second hard mask layer and in the second recess.

12. The manufacturing method of the image sensor structure according to claim 1, further comprising:
    removing the first hard mask layer and the first patterned hard mask layer;
    forming a second patterned hard mask layer on the substrate structure, wherein the second patterned hard mask layer has a second opening;

forming a second hard mask layer on the second patterned hard mask layer, wherein the second hard mask layer is formed in the second opening to form a second recess, and a width of the second recess is smaller than a width of the second opening; and performing a third ion implantation process on the substrate structure by using the second hard mask layer as a mask to form a second isolation region in the substrate structure, wherein the second isolation region is located aside the doped region.

13. The manufacturing method of the image sensor structure according to claim 12, further comprising:

forming an isolation structure in the substrate structure, wherein the second isolation region is located directly below the isolation structure.

14. The manufacturing method of the image sensor structure according to claim 13, wherein a bottom of the doped region is lower than a bottom of the isolation structure.

15. The manufacturing method of the image sensor structure according to claim 12, wherein a bottom of the second isolation region is lower than a bottom of the doped region.

16. The manufacturing method of the image sensor structure according to claim 1, further comprising:

forming a stop layer on the substrate structure before forming the first patterned hard mask layer.

17. The manufacturing method of the image sensor structure according to claim 16, wherein the first patterned hard mask layer is formed on the stop layer.

18. The manufacturing method of the image sensor structure according to claim 16, further comprising:

forming a pad layer on the substrate structure before forming the stop layer.

19. The manufacturing method of the image sensor structure according to claim 18, wherein the stop layer is formed on the pad layer.

20. The manufacturing method of the image sensor structure according to claim 1, wherein the substrate structure comprises:

a substrate; and an epitaxial layer located on the substrate.

* * * * *